(12) United States Patent
Jiang et al.

(10) Patent No.: US 12,719,425 B2
(45) Date of Patent: Aug. 25, 2026

(54) INTERMODULATION DISTORTION MITIGATION

(71) Applicant: Apple Inc., Cupertino, CA (US)

(72) Inventors: Haowei Jiang, San Diego, CA (US); Milad Darvishi, San Diego, CA (US); Ming-Da Tsai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 256 days.

(21) Appl. No.: 18/465,642

(22) Filed: Sep. 12, 2023

(65) Prior Publication Data

US 2025/0088153 A1 Mar. 13, 2025

(51) Int. Cl.
*H03F 3/45* (2006.01)
*H04B 1/04* (2006.01)

(52) U.S. Cl.
CPC ........... *H03F 3/45085* (2013.01); *H04B 1/04* (2013.01); *H04B 2001/0408* (2013.01)

(58) Field of Classification Search
CPC ........... H03F 3/45085; H03F 2200/294; H03F 2200/451; H03F 2203/45458; H03F 2203/45464; H03F 2203/45496; H03F 1/3211; H03F 3/195; H03F 3/245; H03F 3/45183; H03F 1/3205; H04B 1/04; H04B 2001/0408
USPC ........................................................ 455/552.1
See application file for complete search history.

(56) References Cited

U.S. PATENT DOCUMENTS 6,975,838 B1 * 12/2005 Rofougaran ........ H03F 3/45475 455/190.1
7,102,439 B2 9/2006 Heightley et al.
7,276,970 B2 10/2007 Khorramabadi
7,542,739 B2 6/2009 Borremans
7,719,361 B2 5/2010 Pera
8,054,655 B2 11/2011 Moyer et al.
8,149,955 B2 4/2012 Tired
8,604,879 B2 12/2013 Mourant et al.
2003/0114129 A1 * 6/2003 Jerng ....................... H04B 1/18 455/333
2009/0189691 A1 * 7/2009 Deng ...................... H03F 1/223 330/149
2009/0219094 A1 * 9/2009 Kim ..................... H03D 7/1491 330/253

FOREIGN PATENT DOCUMENTS

CN 103248324 A 8/2013
CN 102571227 B 4/2014

OTHER PUBLICATIONS

Qaiser Nehal et al.; “A wideband variable gain amplifier with feedback DC-offset correction in 0.13A m CMOS technology”; Signals and Electronic Systems (ICSES), 2010 International Conference on, IEEE, Sep. 7, 2010; pp. 221-224 (XP031770748).

(Continued)

*Primary Examiner* — Don N Vo
(74) *Attorney, Agent, or Firm* — FLETCHER YODER PC

(57) ABSTRACT

An electronic device includes one or more antennas and a radio frequency front end (RFFE) that is coupled to the one or more antennas. The RFFE includes a differential circuit and a tail current source. The tail current source includes a transistor with a drain coupled to the differential circuit via a tail node. The tail current source also includes a capacitance coupled between the drain and a gate of the transistor.

20 Claims, 9 Drawing Sheets

(56) References Cited

OTHER PUBLICATIONS

Jingyu Hu et al.: "A Fully Integrated Variable-Gain Multi-tanh Low-Noise Amplifier for Tunable FM Radio Receiver Front-End", IEEE Transactions on Circuits and Systems I: Regular Papers, IEEE, vol. 55, No. 7, Aug. 1, 2008; pp. 1805-1814 (XP011224962).

Raju K. et al.: "Design of RF CMOS active mixers for WLAN applications", 2016 International conference on Inventive computation Technologies (ICICT), IEEE, vol. 3, Aug. 26, 2016; p. 1-5 (XP033051274).

Marzieh Mollaalipour et al.: "Volterra series analysis of down-conversion CMOS mixer with high IIP2 and IIP3", Synthesis, Modeling, Analysis and Simulation Methods and Applications to Circuit Design (SMACD), 2012 International Conference on, IEEE, Sep. 19, 2012; pp. 201-204 (XP032264625).

International Search Report and Written Opinion for PCT Application No. PCT/US2024/045479 dated Dec. 9, 2024; 49 pgs.

* cited by examiner

INTERMODULATION DISTORTION MITIGATION

BACKGROUND

The present disclosure relates generally to signal processing, and more specifically to mitigating intermodulation distortion (IMD).

Increasing linearity of a signal processing apparatus may be useful for various reasons. For example, a radio frequency (RF) receiver with increased linearity may achieve a higher signal-to-distortion ratio and/or tolerate stronger in-band blockers. As another example, a RF transmitter with increased linearity may reduce or minimize adjacent channel leakage. An input-referred third order intercept point (IIP3) of a signal processing apparatus, such as an RF circuit, may be one metric for evaluating linearity of the signal processing apparatus. IIP3 relates to an operating point of a signal processing apparatus at which signal power of undesired signals such as third order IMD (IM3) products is equal to signal power of desired signals such as fundamental signals at an output of the signal processing apparatus. IMD may occur when signal power of undesired signals exceeds signal power of desired signals at an output of a signal processing apparatus. IMD may reduce or degrade linearity of a signal processing apparatus. Mitigating IMD may be useful to increase linearity of a signal processing apparatus. Reducing signal power of undesired signals such as IM3 products at an output of a signal processing apparatus may be useful to mitigate IMD.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes one or more antennas and a radio frequency front end (RFFE) that is coupled to the one or more antennas. The RFFE includes a differential circuit and a tail current source. The tail current source includes a transistor with a drain coupled to the differential circuit via a tail node. The tail current source also includes a capacitance coupled between the drain and a gate of the transistor.

In another embodiment, a transceiver includes a filter coupled to one or more antennas and an amplifier coupled to the filter. The amplifier includes a differential circuit and a tail current source. The tail current source includes a transistor, a capacitance, and a resistance. A drain of the transistor is coupled to the differential circuit via a tail node. The capacitance is coupled between the drain and a gate of the transistor. The resistance is coupled to the gate of the transistor to form a bias filter with the capacitance.

In yet another embodiment, an apparatus includes a differential circuit, a transistor, and a bias filter. The transistor includes a drain, a source, and a gate. The drain of the transistor is coupled to the differential circuit via a tail node. The source of the transistor is coupled to a ground node. The bias filter includes a capacitance coupled between the drain and the gate.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
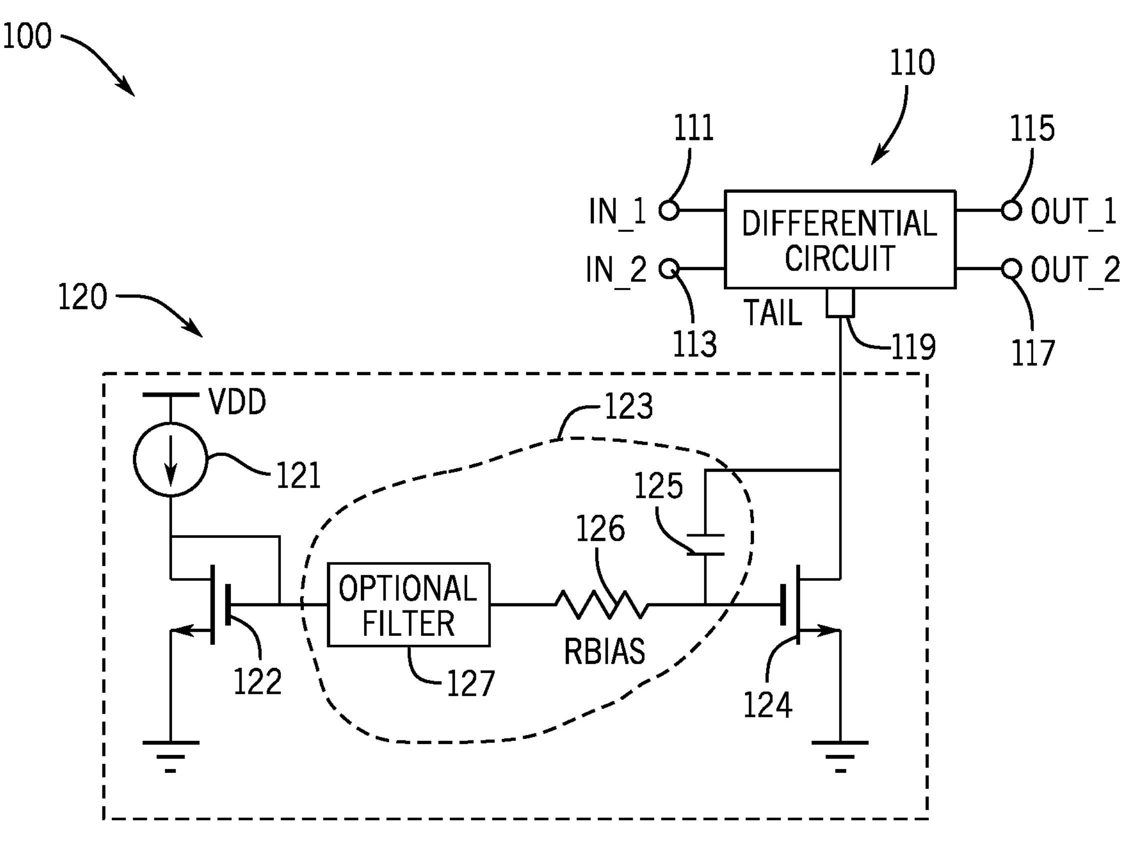
FIG. 1 is a schematic diagram of a signal processing apparatus, in accordance with aspects of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," "proximate to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

As discussed above, increasing linearity of a signal processing apparatus may be useful for various reasons. Intermodulation distortion (IMD) may reduce or degrade linearity of a signal processing apparatus. IMD may occur when signal power of undesired signals, such as third order IMD (IM3) products, exceeds signal power of desired signals, such as fundamental signals, at an output of a signal processing apparatus. IM3 products may be induced in a differential circuit of a signal processing apparatus by intrinsic transistor third order non-linearity. IM3 products may also be induced in the differential circuit by second order IMD (IM2) products mixed with fundamental signals provided at a differential input pair of the differential circuit.

Tail current sources are widely used to bias various differential circuits, such as common-source (CS) amplifiers, common-gate (CG) amplifiers, and active mixers. A differential circuit may include a differential input pair, a differential output pair, and a tail node. The tail node may be coupled between a tail current source and the differential input pair. IM2 products may provide a voltage (e.g., an IM2 voltage) at the tail node that may mix with a first fundamental signal, such as a first RF tone (RF1), provided at a first differential input of the differential input pair. IM2 voltage provided at the tail node may also mix with a second fundamental signal, such as a second RF tone (RF2), provided at a second differential input of the differential input pair. Mixing the IM2 voltage provided at the tail node with the first and second fundamental signals (e.g., RF1 and RF2) provided at the differential input pair may generate a first IM3 product ($IM3_L$) and a second IM3 product ($IM3_H$) at the differential output pair. For example, $IM3_L$ may be at a frequency of 2RF1−RF2 and $IM3_H$ may be at a frequency of 2RF2−RF1. IM2 voltage pickup at the tail node may be relatively stronger at a lower envelope or beat frequency (e.g., ΔRF or RF1−RF2) IM2 product. Such IM2 product induced IM3 product distortion may significantly degrade linearity of a signal processing apparatus.

Embodiments herein provide various apparatuses and techniques to reduce IM2 product induced IM3 product distortion in a signal processing apparatus. To that end, the embodiments disclosed herein include an apparatus having a differential circuit, a bias filter, and a transistor or other switching device, such as a field-effect transistor (FET), a metal-oxide-semiconductor FET (MOSFET), or a bipolar junction transistor (BJT). The transistor and the bias filter may form a tail current source. A drain of the transistor is coupled to a tail node of the differential circuit. A source of the transistor is coupled to a ground node. The bias filter includes a capacitance (e.g., a capacitor or other capacitive device) coupled between the drain and a gate of the transistor. Positioning the capacitance of the bias filter between the drain and the gate of the transistor may lower an impedance (Ztail) of the tail node at lower frequencies corresponding to a frequency band of interest such as 10-400 megahertz (MHZ) for $5^{th}$ generation (5G) cellular network applications. Lowering Ztail may reduce IM2 product induced IM3 product distortion by reducing IM2 voltage pickup at the tail node. Lowering Ztail may also reduce unwanted memory effects by causing a corner frequency (ω1) to be outside of the frequency band of interest.

With the foregoing in mind, FIG. 1 is a schematic diagram of a signal processing apparatus 100, in accordance with aspects of the present disclosure. Example application environments for the apparatus 100 may include a modulator, a power amplifier, a linear noise amplifier, a demodulator, and so on. The apparatus 100 may include, among other things, a differential circuit 110 with a first differential input 111, a second differential input 113, a first differential output 115, a second differential output 117, and a tail node 119. In an embodiment, the differential circuit 110 may represent any differential circuit such as the example implementations of the differential circuit 110 shown by FIGS. 2A-2C. The first differential input 111 and the second differential input 113 may form a differential input pair of the differential circuit 110. The first differential output 115 and the second differential output 117 may form a differential output pair of the differential circuit 110. The apparatus 100 may also include a tail current source 120 with a reference current source 121, a transistor 122, a bias filter 123, and a transistor 124. The bias filter 123 may include a capacitance 125 and a resistance 126.

In an example architecture of the apparatus 100, a first terminal of the reference current source 121 may be coupled to a voltage (VDD) provided by a voltage supply. A source of the transistor 122 may be coupled to a ground node. A gate of the transistor 122 may be coupled to a drain of the transistor 122 to configure the transistor 122 as a diode-connected transistor coupled between a second terminal of the reference current source 121 and the ground node. A source of the transistor 124 may also be coupled to the ground node. A drain of the transistor 124 may be coupled to the tail node 119 of the differential circuit 110 and to a first side of the capacitance 125. A gate of the transistor 124 may be coupled to a second side of the capacitance 125 and to a first side of the resistance 126. A second side of the resistance 126 may be coupled to the gate of the transistor 122, to the drain of the transistor 122, and to the second terminal of the reference current source 121. In an embodiment, the bias filter 123 may also include an additional filter 127 that may be coupled in a cascade configuration with the capacitance 125 and the resistance 126.

In operation, the tail current source 120 may be generally configured to provide a tail or bias current via the tail node 119 to bias the differential circuit 110. In an embodiment, providing the tail or bias current to bias the differential circuit 110 may include the transistor 124 controlling current flow through a differential transistor pair of the differential circuit 110. The differential circuit 110 may be generally configured to receive a differential input signal provided at a differential input pair and to provide a differential output signal at a differential output pair based on the differential input signal. The differential input signal may include a first fundamental signal (e.g., RF1) and a second fundamental signal (e.g., RF2) provided at the first differential input 111 and the second differential input 113, respectively. The differential output signal may include desired signals (e.g., signals to be received or transmitted), such as the first and second fundamental signals provided at the first differential output 115 and the second differential output 117, respectively. The differential output signal provided at the differential output pair of the differential circuit 110 may also include undesired signals, such as IM3 products. The IM3 products provided at the differential output pair of the differential circuit can include IM3 products induced by IM2 products. For example, IM2 products may include an envelope or beat frequency (e.g., ΔRF or RF1−RF2) IM2 product that provides an IM2 voltage at the tail node 119. In this example, the IM2 voltage provided by the envelope or beat frequency IM2 product may mix with the first and second fundamental signals to form a first IM3 product ($IM3_L$) and a second IM3 product ($IM3_H$) at the differential output pair of the differential circuit 110. $IM3_L$ and $IM3_H$ at the differential output pair of the differential circuit 110 may reduce or degrade linearity of the apparatus 100.

A direct relationship may exist between Ztail (e.g., the impedance at the tail node 119) and an IM2 voltage provided by IM2 products at the tail node 119. For example, increasing Ztail at the tail node 119 may increase the IM2 voltage provided by IM2 products at the tail node 119. As another example, decreasing Ztail at the tail node 119 may decrease the IM2 voltage provided by IM2 products at the tail node 119. In an embodiment, Ztail at the tail node 119 may be determined according to:

$$Z_{tail} = r_{ds} \left\| \frac{1}{SC_{ds}} \right\| \frac{1 + \frac{c_{gs}}{c_{gd}} + \frac{1}{SC_{gd}R_{bias}}}{g_m + SC_{gs} + \frac{1}{R_{bias}}} \quad (1)$$

where $R_{bias}$ denotes a resistance value of the resistance 126, $r_{ds}$ denotes a drain-source on-resistance of the transistor 124, $g_m$ denotes an intrinsic small-signal transconductance of the transistor 124, $C_{gs}$ denotes a capacitance between the gate and the source of the transistor 124, $C_{gd}$ denotes a capacitance between the gate and the drain of the transistor 124, and $C_{ds}$ denotes a capacitance between the drain and the source of the transistor 124. In an embodiment, $C_{gs}$, $C_{gd}$, and/or $C_{ds}$ may include a total capacitance between the indicated terminals of the transistor 124, such as intrinsic capacitance of the transistor 124, and/or extrinsic capacitance provided by elements (e.g., the capacitance 125) external to the transistor 124.

Impedance values, such as Ztail at the tail node 119, may vary with respect to frequency. For example, Ztail at the tail node 119 may have a first impedance value (Z1) corresponding to an envelope or beat frequency (e.g., ΔRF or RF1−RF2) of an IM2 product and a second impedance value (Z2) different than Z1 that corresponds to zero frequency (e.g., direct current (DC) voltage). In an embodiment, Z1 (e.g., the impedance value of Ztail proximate to ΔRF or RF1−RF2) may be determined according to:

$$Z_1 \approx \frac{1 + \frac{c_{gs}}{c_{gd}}}{g_m} \quad (2)$$

As a direct relationship may exist between Ztail (e.g., the impedance at the tail node 119) and an IM2 voltage provided by IM2 products at the tail node 119, decreasing Ztail may reduce or facilitate reducing an IM2 voltage provided by IM2 products at the tail node 119. Reducing IM2 voltage provided at the tail node 119 may reduce or facilitate reducing IM2 product induced IM3 product distortion.

Modifying one or more aspects of the tail current source 120 may decrease or facilitate decreasing Ztail with Z1 (e.g., the impedance value of Ztail corresponding to an envelope or beat frequency of an IM2 product) being determined according to equation (2). Such aspects of the tail current source 120 may include $g_m$ (e.g., the intrinsic small-signal transconductance of the transistor 124). For example, increasing $g_m$ of the transistor 124 may decrease an impedance value (e.g., Z1) of Ztail provided at the tail node 119 proximate to the frequency range related to the IM2 product. Such aspects of the tail current source 120 may also include $C_{gd}$, the total capacitance between the gate and the drain of the transistor 124. For example, increasing $C_{gd}$ (e.g., the intrinsic capacitance of the transistor 124, extrinsic capacitance provided by elements (e.g., the capacitance 125) external to the transistor 124, or both) may decrease an impedance value (e.g., Z1) of Ztail provided at the tail node 119 proximate to the frequency range related to the IM2 product. In an embodiment, $C_{gd}$ may include an external capacitor that has a capacitance value of at least 5 picofarads (pF), at least 10 pF, at least 15 pF, and so on. Such aspects of the tail current source 120 may also include $C_{gs}$, the total capacitance between the gate and the source of the transistor 124. For example, decreasing $C_{gs}$ (e.g., the intrinsic capacitance of the transistor 124) may decrease an impedance value (e.g., Z1) of Ztail provided at the tail node 119 proximate to the frequency range related to the IM2 product. In an embodiment, $g_m$ of the transistor 124, $C_{gd}$ (e.g., the total capacitance between the gate and the drain of the transistor 124), $C_{gs}$ (e.g., the total capacitance between the gate and the source of the transistor 124), or both may have respective values that are based on an impedance value (e.g., Z1) of Ztail provided at the tail node 119. That is, the transistor 124 may be configured and/or manufactured such that $C_{gd}$ and/or $C_{gs}$ results in a desired or target impedance value (e.g., Z1) of Ztail provided at the tail node 119.

Ztail at the tail node 119 may have a frequency response that decreases as frequency increases. For example, Z2 (e.g., the value of Ztail proximate to zero frequency or DC) may be greater than Z1 (e.g., the value of Ztail proximate to ΔRF or RF1−RF2). The frequency response of Ztail may include a corner or cutoff frequency (ω1) between Z2 and Z1. In an embodiment, ω1 (e.g., the corner or cutoff frequency where the frequency response of Ztail transitions to Z1) may be determined according to:

$$\omega_1 \approx \frac{1}{R_{bias}(C_{gs} + C_{gd})} \quad (3)$$

Modifying one or more aspects of the tail current source 120 may also be useful to lower ω1 (e.g., the corner or cutoff frequency where the frequency response of Ztail transitions to Z1) with ω1 being determined according to equation (3). Such aspects of the tail current source 120 may include $R_{bias}$, the resistance value of the resistance 126. For example, increasing $R_{bias}$ may reduce or facilitate reducing ω1, the corner or cutoff frequency where the frequency response of Ztail provided at the tail node 119 transitions to Z1. Such aspects of the tail current source 120 may also include $C_{gd}$, the total capacitance between the gate and the drain of the transistor 124. For example, increasing $C_{gd}$ (e.g., the intrinsic capacitance of the transistor 124, extrinsic capacitance provided by elements (e.g., the capacitance 125) external to the transistor 124, or both) may reduce or facilitate reducing ω1, the corner or cutoff frequency where the frequency response of Ztail provided at the tail node 119 transitions to Z1. In an embodiment, $R_{bias}$ (e.g., the resistance value of the resistance 126), $C_{gd}$ (e.g., the total capacitance between the gate and the drain of the transistor 124), and/or $C_{gs}$ (e.g., the total capacitance between the gate and the source of the transistor 124) may have respective values that are based on a corner or cutoff frequency (ω1) of Ztail provided at the tail node 119. That is, the resistance 126 and/or the transistor 124 may be configured and/or manufactured such that Rbias, $C_{gd}$, and/or $C_{gs}$ results in a desired or target corner or cutoff frequency (ω1) of Ztail provided at the tail node 119.

In some instances, ω1 may be sufficiently reduced to be below a lower bound frequency of a frequency range or frequency band of interest for an envelope or beat frequency (e.g., ΔRF or RF1−RF2) of an IM2 product. Causing ω1 to be below a lower bound frequency of a frequency range or frequency band of interest for an envelope or beat frequency (e.g., ΔRF or RF1−RF2) of an IM2 product may reduce or facilitate reducing unwanted memory effects. Reducing unwanted memory effects may be caused by decreasing a difference between a low side (e.g., lower frequency when compared to that of a high side OIP3) output-referred third order intercept point (OIP3) and a high side (e.g., higher frequency when compared to that of a low side OIP3) OIP3 of the differential circuit 110.

Figure 2A:
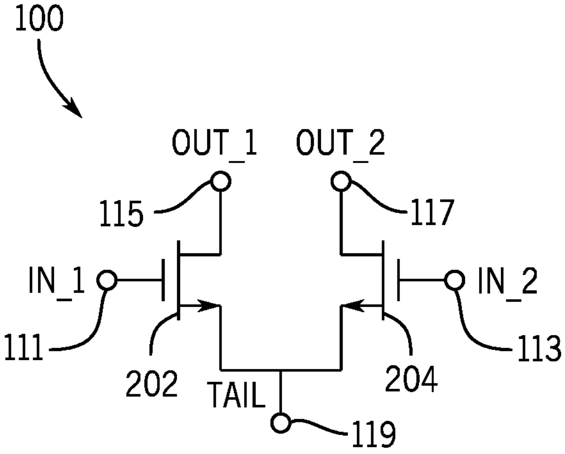
FIGS. 2A-2C are schematic diagrams of example differential circuits of the signal processing apparatus of FIG. 1, in accordance with aspects of the present disclosure.
Figure 2B:
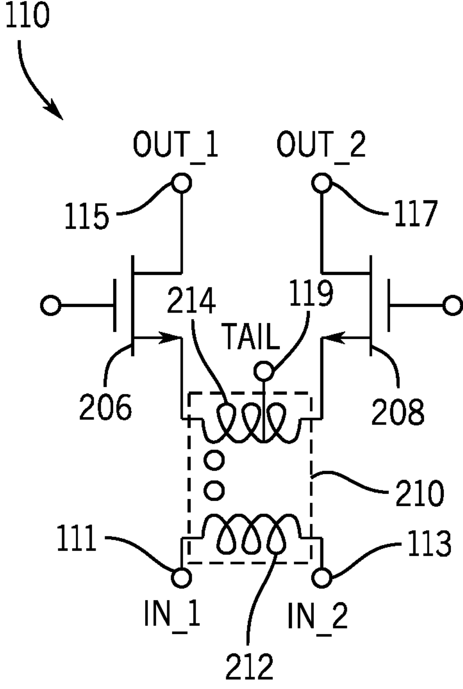
Figure 2C:
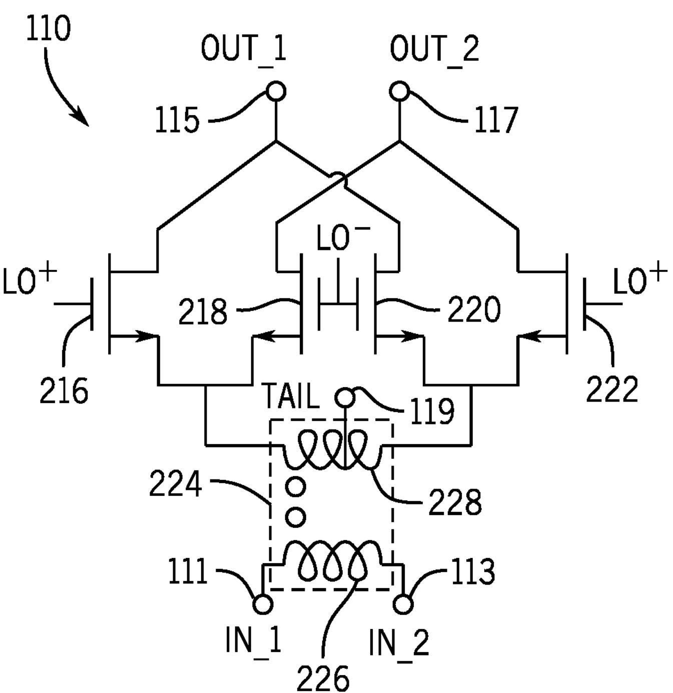

FIGS. 2A-2C are schematic diagrams of example implementations of the differential circuit 110, in accordance with aspects of the present disclosure. FIG. 2A shows that the differential circuit 110 may implement a CS amplifier with a first transistor 202 and a second transistor 204. In an example architecture of the differential circuit 110, a gate of the first transistor 202 may be coupled to the first differential input 111 and a drain of the first transistor 202 may be coupled to the first differential output 115. A gate of the second transistor 204 may be coupled to the second differential input 113 and a drain of the second transistor 204 may be coupled to the second differential output 117. A source of the first transistor 202 and a source of the second transistor 204 may be coupled to the tail node 119. In an embodiment, the first transistor 202 and the second transistor 204 may form a differential transistor pair of the differential circuit 110.

FIG. 2B shows that the differential circuit 110 may implement a CG amplifier with a first transistor 206, a second transistor 208, and a transformer 210 having a first winding or inductance 212 and a second winding or inductance 214. In an example architecture of the differential circuit 110, a first terminal of the first winding 212 may be coupled to the first differential input 111 and a second terminal of the first winding 212 may be coupled to the second differential input 113. A first terminal of the second winding 214 may be coupled to a source of the transistor 206 and a second terminal of the second winding 214 may be coupled to a source of the transistor 208. A gate of the first transistor 206 may be coupled to a reference voltage (e.g., a dedicated reference voltage node) and a drain of the transistor 206 may be coupled to the first differential output 115. In an embodiment, the reference voltage may be provided by a bandage reference voltage generator. A gate of the second transistor 208 may be coupled to a reference voltage (e.g., a dedicated reference voltage node) and a drain of the second transistor 208 may be coupled to the second differential output 117. The tail node 119 may be coupled to a tap positioned between the first and second terminals of the second winding 214. In an embodiment, the first transistor 206 and the second transistor 208 may form a differential transistor pair of the differential circuit 110.

FIG. 2C shows that the differential circuit 110 may implement a mixer (e.g., an active mixer) with a first transistor 216, a second transistor 218, a third transistor 220, a fourth transistor 222, and a transformer 224 having a first winding or inductance 226 and a second winding or inductance 228. In an example architecture of the differential circuit 110, a first terminal of the first winding 226 may be coupled to the first differential input 111 and a second terminal of the first winding 226 may be coupled to the second differential input 113. A first terminal of the second winding 228 may be coupled to a source of the first transistor 216 and to a source of the second transistor 218. A second terminal of the second winding 228 may be coupled to a source of the third transistor 220 and to a source of the fourth transistor 222. A gate of the first transistor 216 and a gate of the fourth transistor 222 may be coupled to a first local oscillator input (LO+). A gate of the second transistor 218 and a gate of the third transistor 220 may be coupled to a second local oscillator input (LO−). A drain of the first transistor 216 and a drain of the fourth transistor 222 may be coupled to the first differential output 115. A drain of the second transistor 218 and a drain of the fourth transistor 222 may be coupled to the second differential output 117. The tail node 119 may be coupled to a tap positioned between the first and second terminals of the second winding 228.

Figure 3:
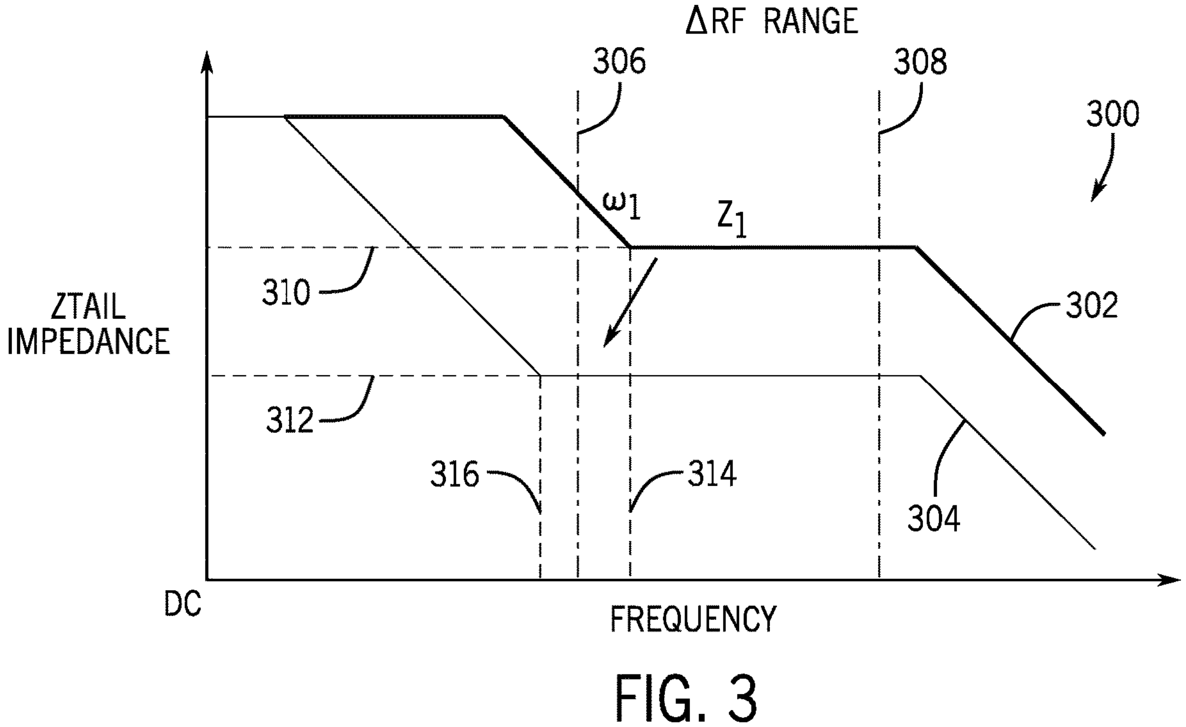
FIG. 3 is a diagram of example impedance curves as a function of frequency, in accordance with aspects of the present disclosure.

FIG. 3 is a diagram 300 of example impedance curves that show a comparison between Ztail provided at the tail node 119 of the differential circuit 110 by the tail current source 120 that includes the capacitance 125 and a tail current source that does not include a capacitance 125. The diagram 300 includes impedance curves 302 and 304 that correspond to Ztail provided at the tail node 119 by the tail current source 120 that includes the capacitance 125 and the tail current source that does not include a capacitance 125, respectively. In the diagram 300, an envelope or beat frequency (e.g., ΔRF or RF1−RF2) of an IM2 product may include any frequency within a frequency range or frequency band of interest that extends from a first frequency 306 to a second frequency 308 that is greater than the first frequency 306. In an embodiment, the first frequency 306 and the second frequency 308 may be 10 MHz and 400 MHZ for 5G cellular network applications, respectively.

The diagram 300 shows that the capacitance 125 may reduce an impedance value (e.g., Z1) of Ztail provided at the tail node 119 proximate to the frequency range related to the IM2 product. For example, the impedance curve 304 corresponding to the tail current source that does not include the capacitance 125 generally has a first impedance value 310 between the first frequency 306 and the second frequency 308. In contrast, the impedance curve 302 corresponding to the tail current source 120 that includes the capacitance 125 has a second impedance value 312 that is less than the first impedance value 310 between the first frequency 306 and the second frequency 308.

The diagram 300 also shows that the capacitance 125 may cause a corner or cutoff frequency (e.g., ω1) of the Ztail provided at the tail node 119 to be below the frequency range related to the IM2 product. For example, the impedance curve 304 corresponding to the tail current source that does not include the capacitance 125 has a first corner frequency 314 that is between the first frequency 306 and the second frequency 308. In contrast, the impedance curve 302 corresponding to the tail current source 120 that includes the capacitance 125 has a second corner frequency 316 that is not between the first frequency 306 and the second frequency 308.

Figure 4:
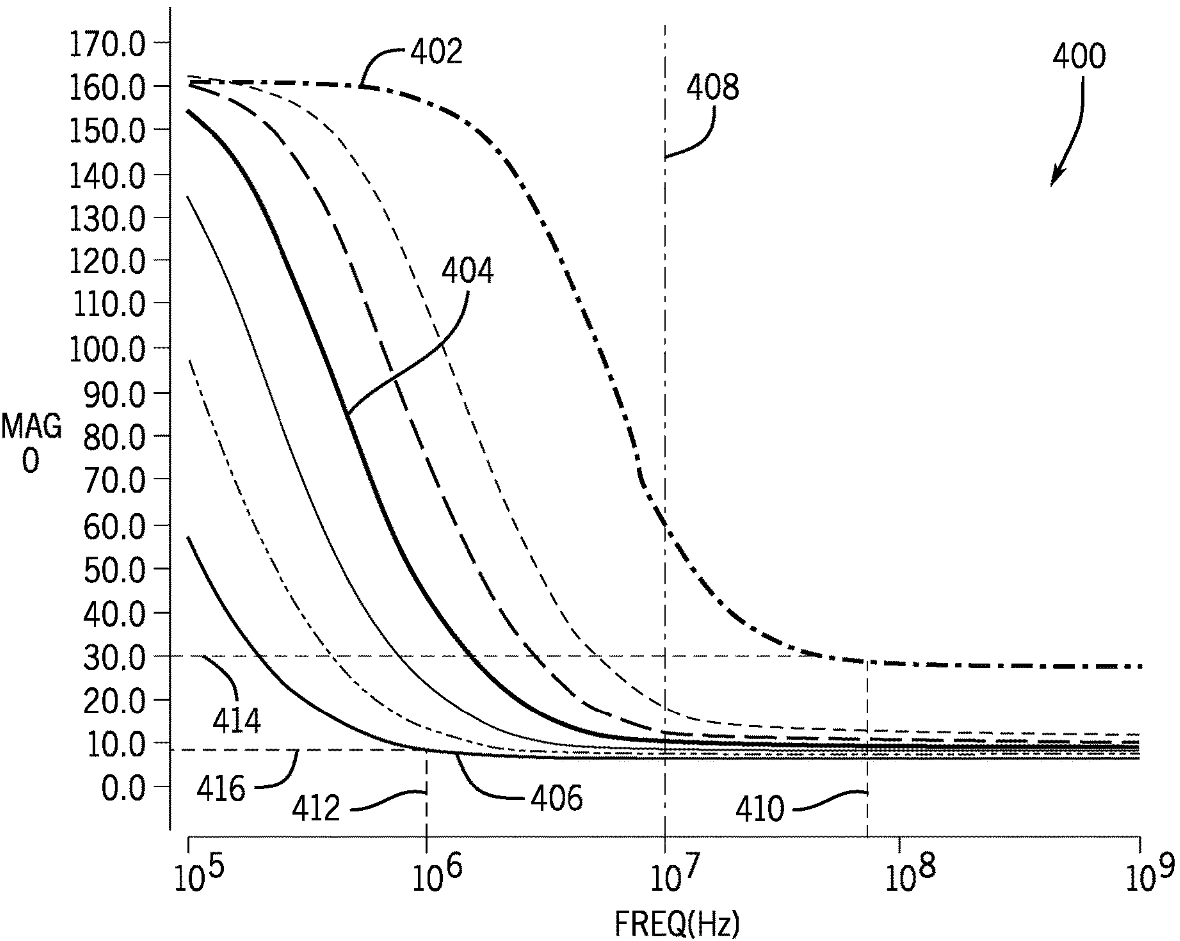
FIG. 4 is a diagram of example impedance curves for different capacitance values, in accordance with aspects of the present disclosure.

FIG. 4 is a diagram 400 of example impedance curves showing variations in Ztail provided at the tail node 119 by the tail current source 120 that correspond to different capacitance values for the capacitance 125 of the bias filter 123. In FIG. 4, the tail node 119 may correspond to a mixer implementation of the differential circuit 110, such as the mixer implementation shown by FIG. 2C. The diagram 400 includes impedance curves 402, 404, and 406 that correspond to Ztail provided at the tail node 119 by the tail current source 120 with the capacitance 125 having capacitance values of 1 femtofarad (fF), 4 pF, and 32 pF, respectively. The diagram 400 also includes a frequency 408 that corresponds to a lower bound frequency of a frequency range or frequency band of interest for an envelope or beat frequency (e.g., ΔRF or RF1−RF2) of an IM2 product. In an embodiment, the frequency 408 may include 10 MHz for 5G cellular network applications. In an embodiment, the frequency 408 may correspond to the first frequency 306 of FIG. 3.

The diagram 400 shows that increasing a capacitance value of the capacitance 125 may cause a corner or cutoff frequency (e.g., ω1) of Ztail provided at the tail node 119 to be below the frequency range related to the IM2 product. For example, the impedance curve 402 corresponding to the tail current source 120 with the capacitance 125 having a capacitance value of 1 fF has a first corner frequency 410 that is greater than the frequency 408. As such, the first corner frequency 410 of the impedance curve 402 is within the frequency range related to the IM2 product. In contrast, the impedance curve 406 corresponding to the tail current source 120 with the capacitance 125 having a capacitance value of 32 pF has a second corner frequency 412 that is less than the frequency 408. As such, the second corner frequency 412 of the impedance curve 406 is below the frequency range related to the IM2 product.

The diagram 400 also shows that increasing a capacitance value of the capacitance 125 may reduce an impedance value (e.g., Z1) of Ztail provided at the tail node 119 by the tail current source 120. For example, the impedance curve 402 corresponding to the tail current source 120 with the capacitance 125 having a capacitance value of 1 fF has a first impedance value 414 (e.g., approximately 30 ohms (Ω)) at the first corner frequency 410. As another example, the impedance curve 406 corresponding to the tail current source 120 with the capacitance 125 having a capacitance value of 32 pF has a second impedance value 416 (e.g., approximately 8Ω) that is less than the first impedance value 414 at the second corner frequency 412.

Figure 5:
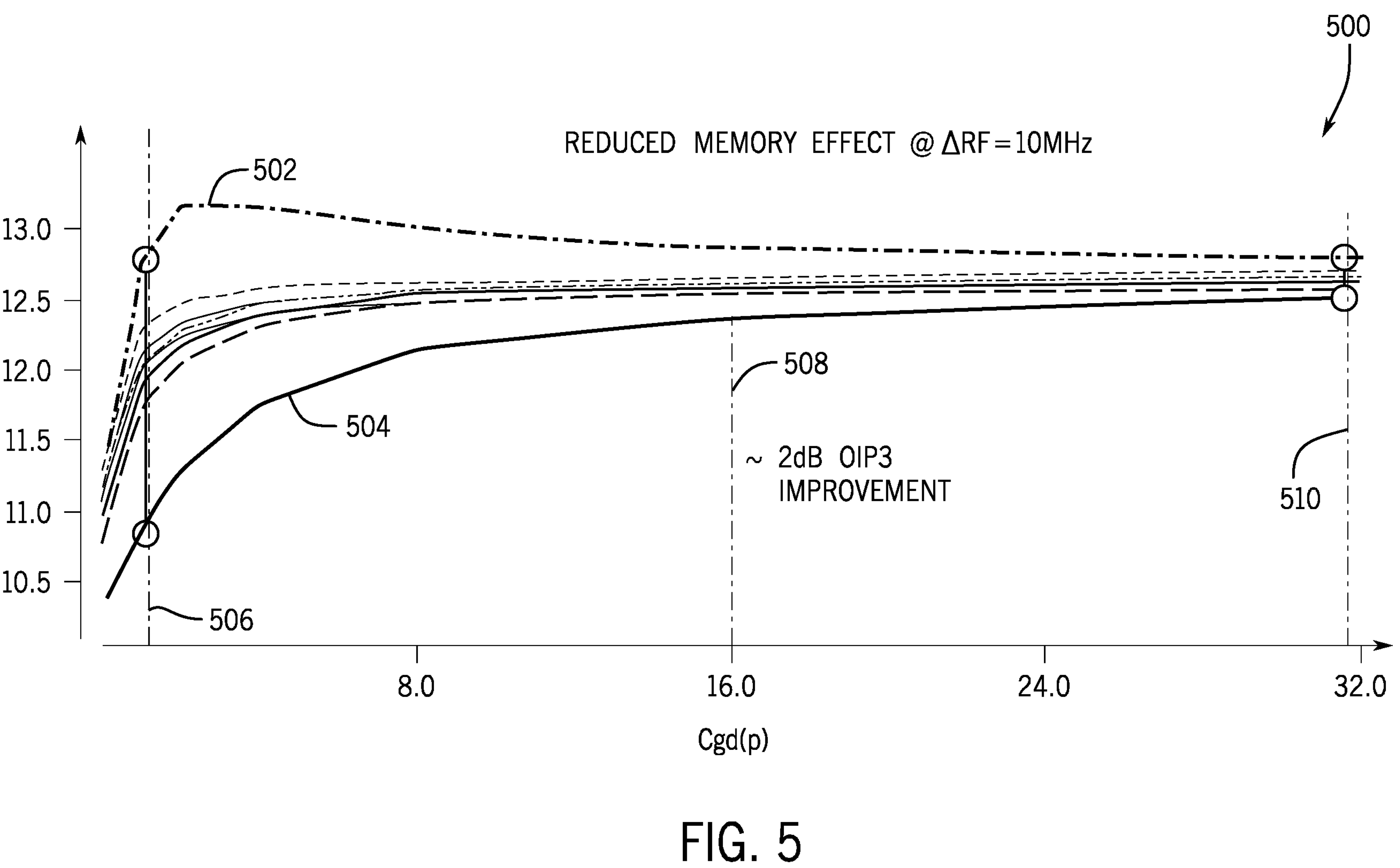
FIG. 5 is a graph of output-referred third order intercept point (OIP3) values as a function of capacitance values, in accordance with aspects of the present disclosure.

FIG. 5 is a graph 500 showing example OIP3 of the differential circuit 110 in decibels (dB) versus capacitance values of the capacitance 125 in pF for different envelope or beat frequencies (e.g., ΔRF or RF1−RF2) of an IM2 product. In FIG. 5, the differential circuit 110 may include a mixer implementation of the differential circuit 110, such as the mixer implementation shown by FIG. 2C. The graph 500 includes line 502 that represents low side OIP3 corresponding to an $IM3_L$ product induced by an IM2 product at an envelope or beat frequency of about 10 MHz. The graph 500 also includes line 504 that represents high side OIP3 corresponding to an $IM3_H$ product induced by the IM2 product at the envelope or beat frequency of about 10 MHz.

The graph 500 shows that increasing a capacitance value of the capacitance 125 in the tail current source 120 may improve OIP3 of the differential circuit 110. For example, increasing the capacitance value of the capacitance 125 from a first capacitance value 506 (e.g., 1 pF) to a second capacitance value 508 (e.g., 16 pF) improves low side OIP3 represented by line 502 by about 2 dB. The graph 500 also shows that increasing a capacitance value of the capacitance 125 in the tail current source 120 may decrease a difference between low side OIP3 and high side OIP3 of the differential circuit 110. For example, increasing the capacitance value of the capacitance 125 from the first capacitance value 506 (e.g., 1 pF) to a third capacitance value 510 (e.g., 32 pF) decreases a difference between low side OIP3 and high side OIP3 represented by lines 502 and 504, respectively, from about 2 dB at the first capacitance value 506 to about 0.2 dB at the third capacitance value 510. Decreasing a difference between low side OIP3 and high side OIP3 of the differential circuit 110 may reduce or facilitate reducing unwanted memory effects.

Figure 6:
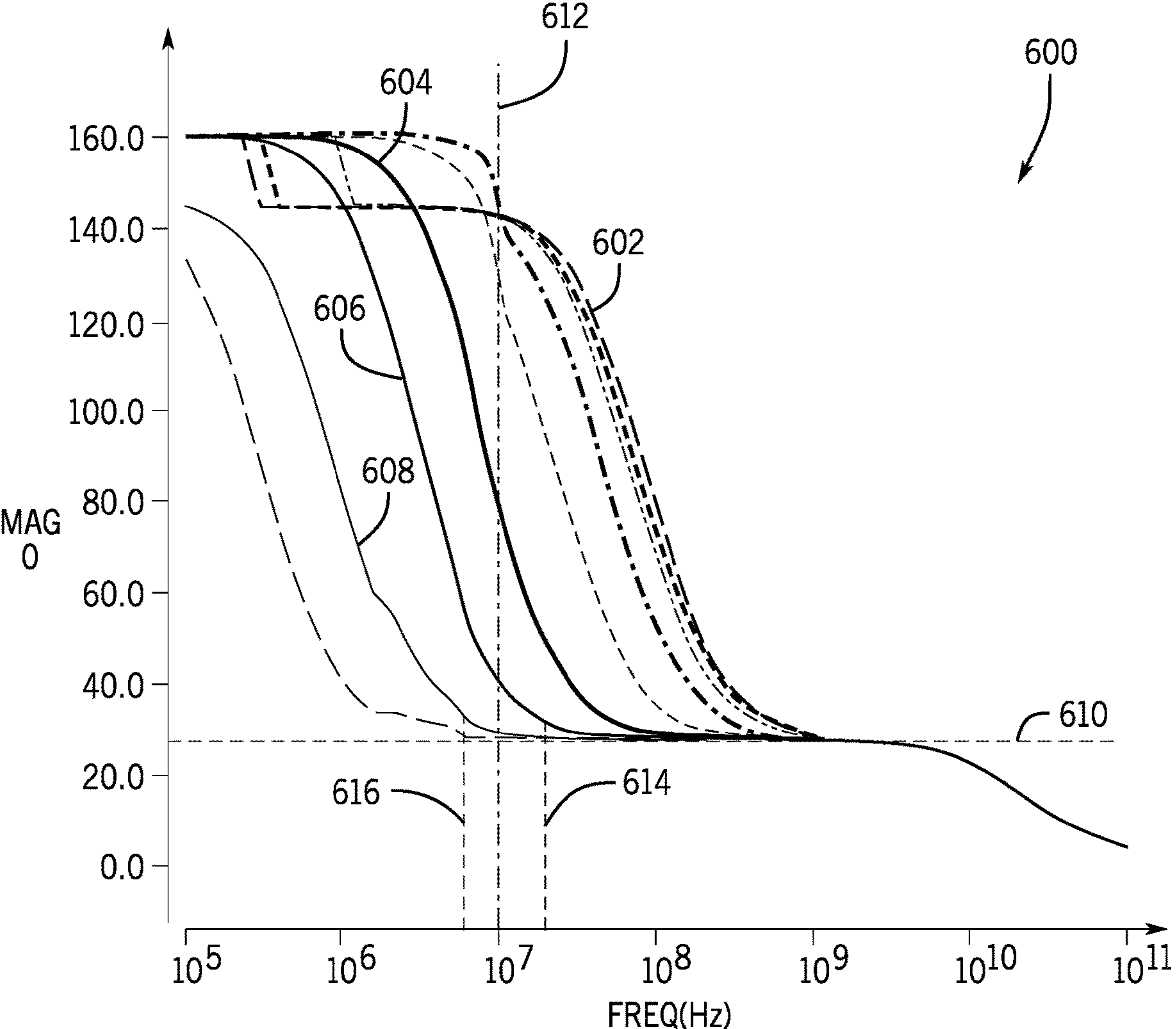
FIG. 6 is a diagram of example impedance curves for different resistance values, in accordance with aspects of the present disclosure.

FIG. 6 is a diagram 600 of example impedance curves showing variations in Ztail provided at the tail node 119 by the tail current source 120 that correspond to different resistance values for the resistance 126 of the bias filter 123. The diagram 600 includes impedance curves 602, 604, 606, and 608 that correspond to Ztail provided at the tail node 119 by the tail current source 120 with the resistance 126 having resistance values of 1 Ω, 3.33 kiloohms (kΩ), 10 kΩ, and 33.3 kΩ, respectively. The diagram 600 also includes a frequency 612 that corresponds to a lower bound frequency of a frequency range or frequency band of interest for an envelope or beat frequency (e.g., ΔRF or RF1−RF2) of an IM2 product. In an embodiment, the frequency 612 may include 10 MHz for 5G cellular network applications. In an embodiment, the frequency 612 may correspond to the first frequency 306 of FIG. 3.

The diagram 600 shows that Ztail provided at the tail node 119 by the tail current source 120 may generally remain unchanged as resistance values for the resistance 126 change. For example, Ztail provided at the tail node 119 remains at an impedance value 610 for each impedance curve (e.g., impedance curves 602, 604, 606, and 608) shown in FIG. 6. The diagram 600 also shows that increasing a resistance value of the resistance 126 may cause a corner or cutoff frequency (e.g., ω1) of Ztail provided at the tail node 119 to be below the frequency range related to the IM2 product. For example, the impedance curve 606 corresponding to the tail current source 120 with the resistance 126 having a resistance value of 10 kΩ has a first corner frequency 614 that is greater than the frequency 612. As such, the first corner frequency 614 of the impedance curve 606 is within the frequency range related to the IM2 product. In contrast, the impedance curve 608 corresponding to the tail current source 120 with the resistance 126 having a resistance value of 33.3 kΩ has a second corner frequency 616 that is less than the frequency 612. As such, the second corner frequency 616 of the impedance curve 608 is below the frequency range related to the IM2 product.

Figure 7:
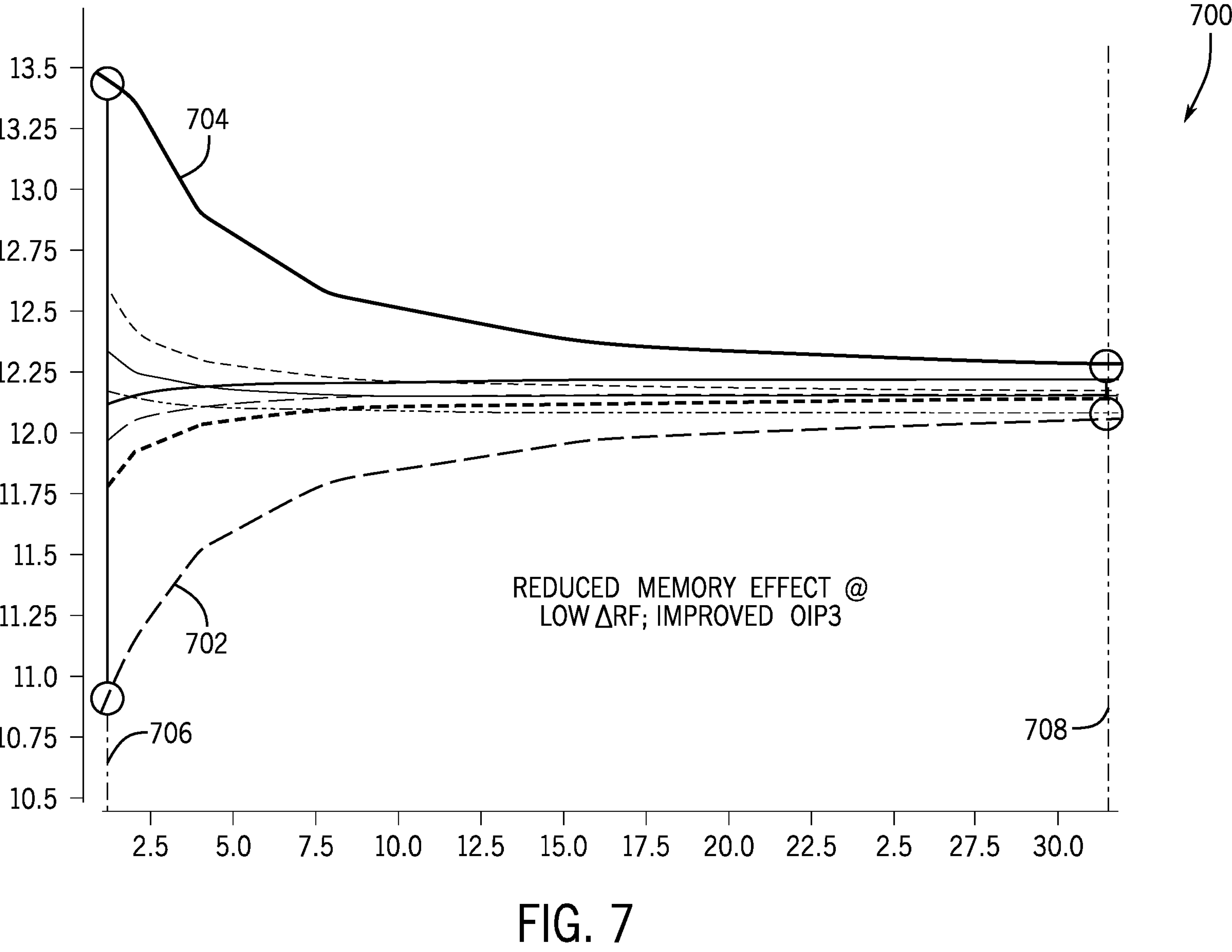
FIG. 7 is a graph of example OIP3 values as a function of resistance values, in accordance with aspects of the present disclosure.

FIG. 7 is a graph 700 showing example OIP3 of the differential circuit 110 in dB versus resistance values of the resistance 126 in kΩ for different envelope or beat frequencies (e.g., ΔRF or RF1−RF2) of an IM2 product. The graph 700 includes line 702 that represents low side OIP3 corresponding to an $IM3_L$ product induced by an IM2 product at an envelope or beat frequency of about 10 MHz. The graph 700 also includes line 704 that represents high side OIP3 corresponding to an $IM3_H$ product induced by the IM2 product at the envelope or beat frequency of about 10 MHz. The graph 700 shows that increasing a resistance value of the resistance 126 in the tail current source 120 may decrease a difference between low side OIP3 and high side OIP3 of the differential circuit 110. For example, increasing the resistance value of the resistance 126 from a first resistance value 706 (e.g., 1 kΩ) to a second resistance value 708 (e.g., 33.3 kΩ) decreases a difference between low side OIP3 and high side OIP3 represented by lines 702 and 704, respectively, from about 2.5 dB at the first resistance value 706 to about 0.2 dB at the second resistance value 708. Decreasing a difference between low side OIP3 and high side OIP3 of the differential circuit 110 can be useful to reduce unwanted memory effects.

Figure 8:
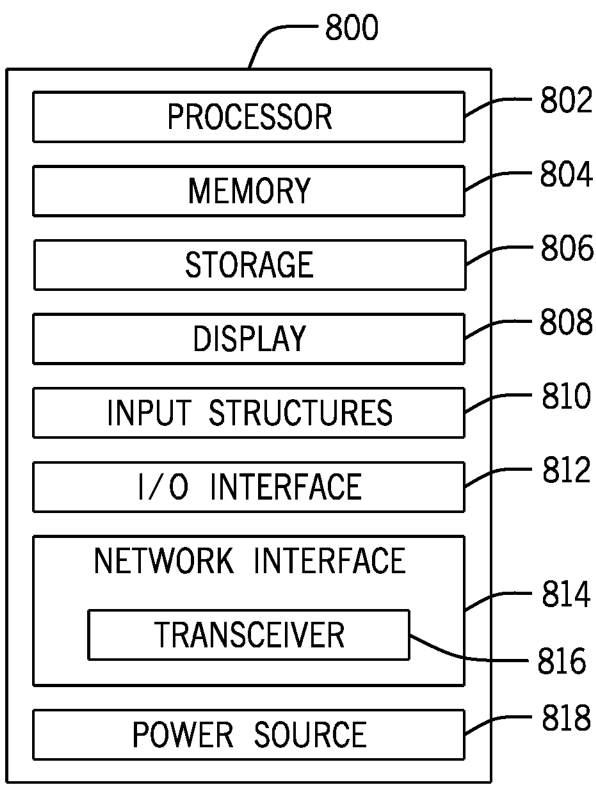
FIG. 8 is a block diagram of an electronic device that includes the signal processing apparatus of FIG. 1, in accordance with aspects of the present disclosure.

FIG. 8 is a block diagram of an electronic device 800, according to embodiments of the present disclosure. The electronic device 800 may represent an example application environment for the apparatus 100. The electronic device 800 may include, among other things, one or more processors 802 (collectively referred to herein as a single processor for convenience, which may be implemented in any suitable form of processing circuitry), memory 804, nonvolatile storage 806, a display 808, input structures 810, an input/output (I/O) interface 812, a network interface 814, and a power source 818. The various functional blocks shown in FIG. 8 may include hardware elements (including circuitry), software elements (including machine-executable instructions) or a combination of both hardware and software elements (which may be referred to as logic). The processor 802, memory 804, the nonvolatile storage 806, the display 808, the input structures 810, the I/O interface 812, the network interface 814, and/or the power source 818 may each be communicatively coupled directly or indirectly (e.g., through or via another component, a communication bus, a network) to one another to transmit and/or receive signals between one another. It should be noted that FIG. 8 is merely one example of a particular implementation and is intended to illustrate the types of components that may be present in the electronic device 800.

By way of example, the electronic device 800 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 800 may include an access point, such as a base station, a router (e.g., a wireless or Wi-Fi router), a hub, a switch, and so on. It should be noted that the processor 802 and other related items in FIG. 8 may be embodied wholly or in part as software, hardware, or both. Furthermore, the processor 802 and other related items in FIG. 8 may be a single contained processing module or may be incorporated wholly or partially within any of the other elements within the electronic device 800. The processor 802 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 802 may include one or more application processors, one or more baseband processors, or both, and perform the various functions described herein.

In the electronic device 800 of FIG. 8, the processor 802 may be operably coupled with a memory 804 and a nonvolatile storage 806 to perform various algorithms. Such programs or instructions executed by the processor 802 may be stored in any suitable article of manufacture that includes one or more tangible, computer-readable media. The tangible, computer-readable media may include the memory 804 and/or the nonvolatile storage 806, individually or collectively, to store the instructions or routines. The memory 804 and the nonvolatile storage 806 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 802 to enable the electronic device 800 to provide various functionalities.

In certain embodiments, the display 808 may facilitate users to view images generated on the electronic device 800. In some embodiments, the display 808 may include a touch screen, which may facilitate user interaction with a user interface of the electronic device 800. Furthermore, it should be appreciated that, in some embodiments, the display 808 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 810 of the electronic device 800 may enable a user to interact with the electronic device 800 (e.g., pressing a button to increase or decrease a volume level). The I/O interface 812 may enable electronic device 800 to interface with various other electronic devices, as may the network interface 814. In some embodiments, the I/O interface 812 may include an I/O port for a hardwired connection for charging and/or content manipulation using a standard connector and protocol, such as the Lightning connector, a universal serial bus (USB), or other similar connector and protocol. The network interface 814 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3$^{rd}$ generation (3G) cellular network, universal mobile telecommunication system (UMTS), 4$^{th}$ generation (4G) cellular network, Long Term Evolution® (LTE) cellular network, Long Term Evolution License Assisted Access (LTE-LAA) cellular network, 5$^{th}$ generation (5G) cellular network, and/or New Radio (NR) cellular network, a 6$^{th}$ generation (6G) or greater than 6G cellular network, a satellite network, a non-terrestrial network, and so on. In particular, the network interface 814 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 814 of the electronic device 800 may allow communication over the aforementioned networks (e.g., 5G, Wi-Fi, LTE-LAA, and so forth).

The network interface 814 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 814 may include a transceiver 816. In some embodiments, all or portions of the transceiver 816 may be disposed within the processor 802. The transceiver 816 may support transmission and receipt of various wireless signals via one or more antennas, and thus may include a transmitter and a receiver. The power source 818 of the electronic device 800 may include any suitable source of power, such as a rechargeable lithium polymer (Li-poly) battery and/or an alternating current (AC) power converter.

Figure 9:
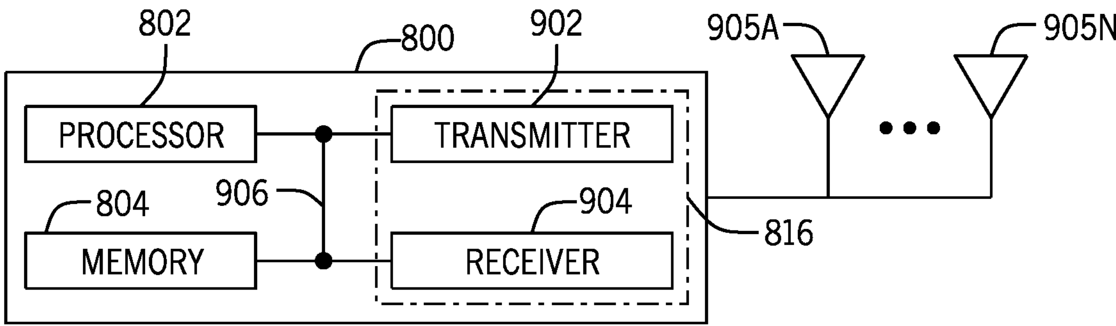
FIG. 9 is a functional diagram of the electronic device of FIG. 8, in accordance with aspects of the present disclosure.

FIG. 9 is a functional diagram of the electronic device 800 of FIG. 8, according to embodiments of the present disclosure. As illustrated, the processor 802, the memory 804, the transceiver 816, a transmitter 902, a receiver 904, and/or antennas 905 (illustrated as 905A-905N, collectively referred to as an antenna 905) may be communicatively coupled directly or indirectly (e.g., through or via another component, a communication bus, a network) to one another to transmit and/or receive signals between one another.

The electronic device 800 may include the transmitter 902 and/or the receiver 904 that respectively enable transmission and reception of signals between the electronic device 800 and an external device via, for example, a network (e.g., including base stations or access points) or a direct connection. As illustrated, the transmitter 902 and the receiver 904 may be combined into the transceiver 816. The electronic device 800 may also have one or more antennas 905A-905N electrically coupled to the transceiver 816. The antennas 905A-905N may be configured in an omnidirectional or directional configuration, in a single-beam, dual-beam, or multi-beam arrangement, and so on. Each antenna 905 may be associated with one or more beams and various configurations. In some embodiments, multiple antennas of the antennas 905A-905N of an antenna group or module may be communicatively coupled to a respective transceiver 816 and each emit radio frequency signals that may constructively and/or destructively combine to form a beam. The electronic device 800 may include multiple transmitters, multiple receivers, multiple transceivers, and/or multiple antennas as suitable for various communication standards. In some embodiments, the transmitter 902 and the receiver 904 may transmit and receive information via other wired or wireline systems or means.

As illustrated, the various components of the electronic device 800 may be coupled together by a bus system 906. The bus system 906 may include a data bus, for example, as well as a power bus, a control signal bus, and a status signal bus, in addition to the data bus. The components of the electronic device 800 may be coupled together or accept or provide inputs to each other using some other mechanism.

Figures 10, 11:
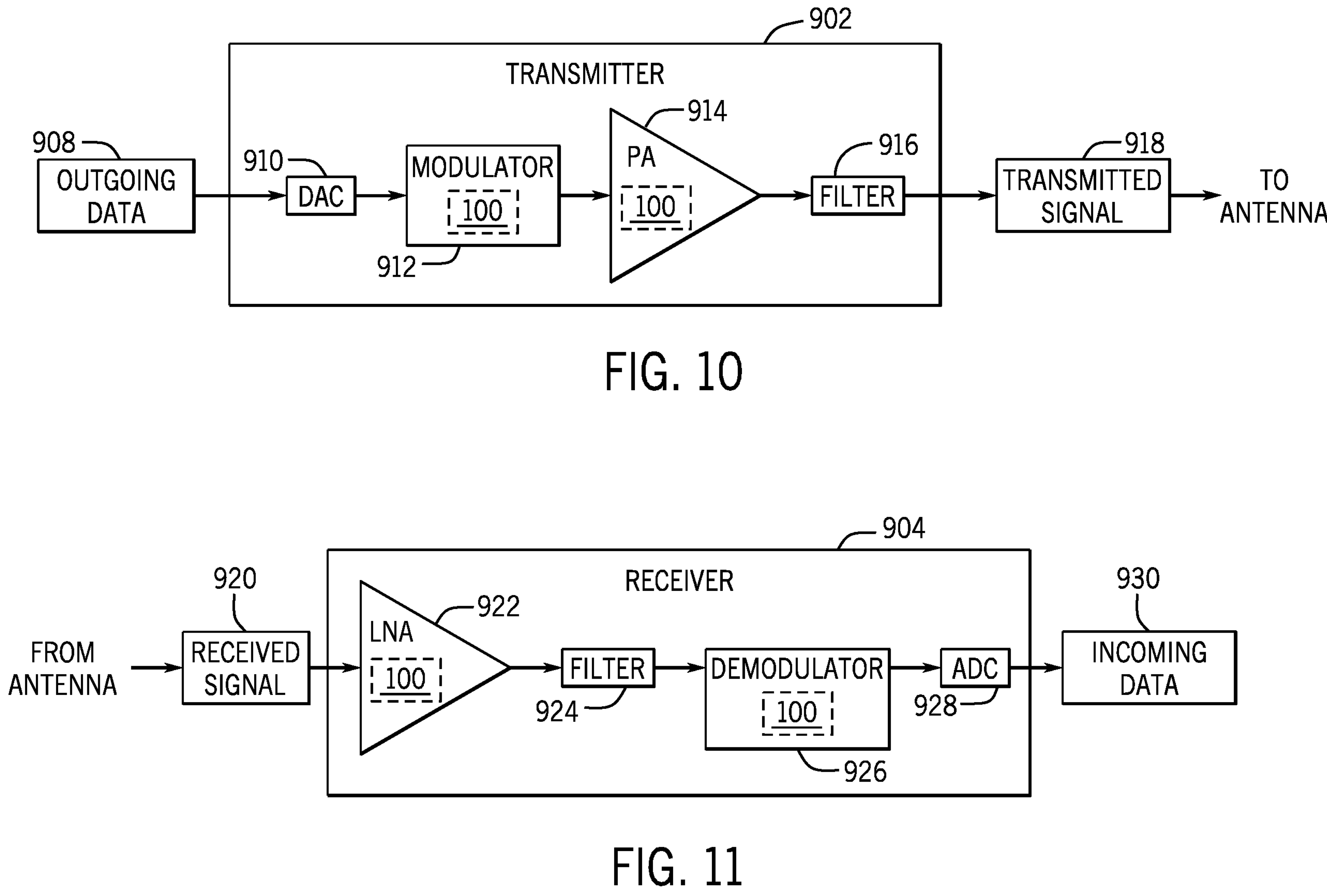
FIG. 10 is a schematic diagram of a transmitter of the electronic device of FIG. 8 that includes the signal processing apparatus of FIG. 1, in accordance with aspects of the present disclosure.
FIG. 11 is a schematic diagram of a receiver of the electronic device of FIG. 8 that includes the signal processing apparatus of FIG. 1, in accordance with aspects of the present disclosure.

FIG. 10 is a schematic diagram of the transmitter 902 (e.g., transmit circuitry), according to embodiments of the present disclosure. As illustrated, the transmitter 902 may receive outgoing data 908 in the form of a digital signal to be transmitted via the one or more antennas 905. A digital-to-analog converter (DAC) 910 of the transmitter 902 may convert the digital signal to an analog signal. A modulator 912 may combine the converted analog signal with a carrier signal to generate a radio frequency signal. To that end, the modulator 912 may include the signal processing apparatus 100, such as in a mixer and in the form of the example implementation of the differential circuit 110 shown by FIG. 2C. A power amplifier (PA) 914 receives the radio frequency signal from the modulator 912. The power amplifier 914 may amplify the modulated signal to a suitable level to drive transmission of the signal via the one or more antennas 905. The power amplifier 914 may include the signal processing apparatus 100, such as a CG amplifier or a CS amplifier and in the form of the example implementations of the differential circuit 110 shown by FIGS. 2A and 2B, respectively. A filter 916 (e.g., filter circuitry and/or software) of the transmitter 902 may then remove undesirable noise from the amplified signal to generate transmitted signal 918 to be transmitted via the one or more antennas 905. The filter 916 may include any suitable filter or filters to remove the undesirable noise from the amplified signal, such as a bandpass filter, a bandstop filter, a low pass filter, a high pass filter, and/or a decimation filter.

Furthermore, the power amplifier 914 and/or the filter 916 may be referred to as part of a radio frequency front end (RFFE), and more specifically, a transmit front end (TXFE) of the electronic device 800. Additionally, the transmitter 902 may include any suitable additional components not shown, or may not include certain of the illustrated components, such that the transmitter 902 may transmit the outgoing data 908 via the one or more antennas 905. For example, the transmitter 902 may include an additional mixer and/or a digital up converter (e.g., for converting an input signal from a baseband frequency to an intermediate frequency). As another example, the transmitter 902 may not include the filter 916 if the power amplifier 914 outputs the amplified signal in or approximately in a desired frequency range (such that filtering of the amplified signal may be unnecessary).

FIG. 11 is a schematic diagram of the receiver 904 (e.g., receive circuitry), according to embodiments of the present disclosure. As illustrated, the receiver 904 may receive received signal 920 from the one or more antennas 905 in the form of an analog signal. A low noise amplifier (LNA) 922 may amplify the received analog signal to a suitable level for the receiver 904 to process. The LNA 922 may include the signal processing apparatus 100, such as a CG amplifier or a CS amplifier and in the form of the example implementations of the differential circuit 110 shown by FIGS. 2A and 2B, respectively. A filter 924 (e.g., filter circuitry and/or software) may remove undesired noise from the received signal, such as cross-channel interference. The filter 924 may also remove additional signals received by the one or more antennas 905 that are at frequencies other than the desired signal. The filter 924 may include any suitable filter or filters to remove the undesired noise or signals from the received signal, such as a bandpass filter, a bandstop filter, a low pass filter, a high pass filter, and/or a decimation filter. The low noise amplifier 922 and/or the filter 924 may be referred to as part of the RFFE, and more specifically, a receiver front end (RXFE) of the electronic device 800.

A demodulator 926 may remove a radio frequency carrier signal and/or extract a demodulated signal (e.g., an envelope signal) from the filtered signal for processing. To that end, the demodulator 926 may include the signal processing apparatus 100, such as a mixer and in the form of the example implementation of the differential circuit 110 shown by FIG. 2C. An analog-to-digital converter (ADC) 928 may receive the demodulated analog signal and convert that signal to a digital signal of incoming data 930 to be further processed by the electronic device 800. Additionally, the receiver 904 may include any suitable additional components not shown, or may not include certain of the illustrated components, such that the receiver 904 may receive the received signal 920 via the one or more antennas 905. For example, the receiver 904 may include an additional mixer and/or a digital down converter (e.g., for converting an input signal from an intermediate frequency to a baseband frequency).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:
one or more antennas; and
a radio frequency front end (RFFE) coupled to the one or more antennas, wherein the RFFE comprises
a differential circuit comprising a winding, and
a tail current source that includes
a transistor with a drain coupled to the differential circuit via a tail node, and
a capacitance coupled between the drain and a gate of the transistor, the tail node being coupled to the winding.

2. The electronic device of claim 1, wherein the capacitance comprises a capacitance value that is based on an impedance provided at the tail node by an intermodulation distortion product.

3. The electronic device of claim 1, wherein a capacitance value of the capacitance reduces a voltage provided at the tail node by an intermodulation distortion product.

4. The electronic device of claim 1, wherein a capacitance value of the capacitance causes a corner frequency of an impedance provided at the tail node by an intermodulation distortion product to be below a frequency corresponding to the intermodulation distortion product.

5. The electronic device of claim 1, wherein the tail node is coupled between a first terminal of the winding and a second terminal of the winding.

6. A transceiver, comprising:
a filter configured to couple to one or more antennas; and
an amplifier coupled to the filter, wherein the amplifier includes
a differential circuit, and
a tail current source that includes a transistor with a drain coupled to the differential circuit via a tail node,
a capacitance coupled between the drain and a gate of the transistor, and a resistance coupled to the gate of the transistor to form a bias filter with the capacitance, the resistance comprising a resistance value that is based on a corner frequency of an impedance provided at the tail node by an intermodulation distortion product.

7. The transceiver of claim 6, wherein the resistance value causes the corner frequency to be below a frequency corresponding to the intermodulation distortion product.

8. The transceiver of claim 7, wherein the frequency is within a frequency range having a lower bound frequency of 10 megahertz (MHz) and an upper bound frequency of 400 MHz.

9. The transceiver of claim 6, wherein the bias filter comprises a resistance coupled to the gate and an additional filter coupled in a cascade configuration with the capacitance and the resistance.

10. An apparatus comprising:
a differential circuit;
a transistor that comprises a drain coupled to the differential circuit via a tail node, a source coupled to a ground node, and a gate; and
a bias filter that includes
a capacitance coupled between the drain and the gate,
a resistance coupled to the gate, and
an additional filter coupled in a cascade configuration with the capacitance and the resistance.

11. The apparatus of claim 10, wherein the capacitance comprises a capacitance value that is based on an impedance provided at the tail node by an intermodulation distortion product.

12. The apparatus of claim 10, wherein a transconductance of the transistor reduces an impedance provided at the tail node by an intermodulation distortion product.

13. The apparatus of claim 10, wherein a capacitance value of the capacitance decreases a difference between a low side output-referred third order intercept point (OIP3) and a high side OIP3 of the differential circuit.

14. The apparatus of claim 10, comprising a reference current source coupled to the gate and the bias filter.

15. The apparatus of claim 14, comprising a diode-connected transistor coupled between the reference current source and the gate.

16. The apparatus of claim 10, wherein the differential circuit comprises an inductance, and a tap of the inductance is coupled to the tail node.

17. The apparatus of claim 10, wherein the bias filter comprises a resistance coupled to the gate.

18. The apparatus of claim 17, wherein the resistance comprises a resistance value that is based on a corner frequency of an impedance provided at the tail node by an intermodulation distortion product.

19. The apparatus of claim 10, wherein the differential circuit comprises a differential amplifier or a mixer circuit.

20. The apparatus of claim 10, wherein the capacitance is provided by an external capacitor having a capacitance value of at least 10 picofarads.

* * * * *